(12) United States Patent
Ishiwata (10) Patent No.: US 7,713,664 B2
(45) Date of Patent: May 11, 2010

(54) METHOD FOR FABRICATING AN ATTENUATED PHASE SHIFT PHOTOMASK BY SEPARATE PATTERNING OF NEGATIVE AND POSITIVE RESIST LAYERS WITH CORRESPONDING ETCHING STEPS FOR UNDERLYING LIGHT-SHIELDING AND PHASE SHIFT LAYERS ON A TRANSPARENT SUBSTRATE

(75) Inventor: Naoyuki Ishiwata, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 1071 days.

(21) Appl. No.: 11/367,280

(22) Filed: Mar. 6, 2006

(65) Prior Publication Data

US 2007/0065731 A1 Mar. 22, 2007

(30) Foreign Application Priority Data

Sep. 21, 2005 (JP) ............................. 2005-274717

(51) Int. Cl.
*G03F 1/08* (2006.01)
*G03F 1/14* (2006.01)
*G03F 9/00* (2006.01)
(52) U.S. Cl. ................................ 430/5; 216/12; 430/22
(58) Field of Classification Search ................... 216/12; 430/5
See application file for complete search history.

(56) References Cited

U.S. PATENT DOCUMENTS

| 6,440,613 | B1 * | 8/2002 | Doan | 430/5 |
| 2002/0006555 | A1 * | 1/2002 | Hasegawa et al. | 430/5 |
| 2003/0165750 | A1 * | 9/2003 | Tanaka et al. | 430/5 |

FOREIGN PATENT DOCUMENTS

JP 08082916 A * 3/1996

OTHER PUBLICATIONS

English abstract of JP-08-082916 from East search.*
JPO machine translation of JP-08-082916.*

* cited by examiner

*Primary Examiner*—Mark F Huff
*Assistant Examiner*—John Ruggles
(74) *Attorney, Agent, or Firm*—Westerman, Hattori, Daniels & Adrian, LLP (57) ABSTRACT

A method for fabricating a photomask includes the steps of forming a phase shift layer, a light-shielding layer, and a negative resist layer in that order on a transparent substrate, forming a first resist pattern including a pattern corresponding to a transfer pattern by performing first exposure and development on the negative resist layer, forming a light-shielding pattern by etching the light-shielding layer using the first resist pattern as a mask, removing the first resist pattern, and then forming a positive resist layer thereon, forming a second resist pattern including a pattern corresponding to a light-absorbing pattern by performing second exposure and development on the positive resist layer, and forming a phase shift pattern by etching the phase shift layer using the second resist pattern as a mask.

15 Claims, 10 Drawing Sheets

METHOD FOR FABRICATING AN ATTENUATED PHASE SHIFT PHOTOMASK BY SEPARATE PATTERNING OF NEGATIVE AND POSITIVE RESIST LAYERS WITH CORRESPONDING ETCHING STEPS FOR UNDERLYING LIGHT-SHIELDING AND PHASE SHIFT LAYERS ON A TRANSPARENT SUBSTRATE

BACKGROUND OF THE INVENTION

1. Field of the Invention

The present invention relates to a photomask mainly used for projection aligners, a method for fabricating a photomask, and a method for fabricating a semiconductor device. More particularly, the invention relates to a photomask having a function of shifting a phase of projected exposure light passing through the photomask, a method for fabricating the photomask, and a method for fabricating a semiconductor device using such a photomask.

2. Description of the Related Art

Recently, in the fabrication of large-scale integrated circuits (LSIs), formation of very fine patterns are required. Consequently, in the exposure process in which fine circuit patterns are transferred onto semiconductor substrates (hereinafter referred to as "wafers"), photomasks having a function of shifting phases of exposure light to increase contrast (hereinafter referred to as "phase shift masks") have been used.

Among them, an attenuated phase shift mask having a transmittance of several percent is widely used in the current manufacture of devices. This type of mask also has the function of providing a phase shift to increase contrast so that high-resolution pattern transfer is enabled. Hence this type of mask is preferred because of ease of fabrication, etc.

Generally in these phase shift masks, a phase shift pattern which shifts a phase of exposure light and a light-shielding pattern which blocks exposure light are disposed on a transparent substrate composed of quartz glass or the like.

The light-shielding pattern is provided in a region (hereinafter referred to as a "peripheral region") in the periphery of a region for transferring a circuit pattern to a chip in the wafer (hereinafter referred to as a "main region"), and has a function of blocking unnecessary exposure light.

Figure 1A:
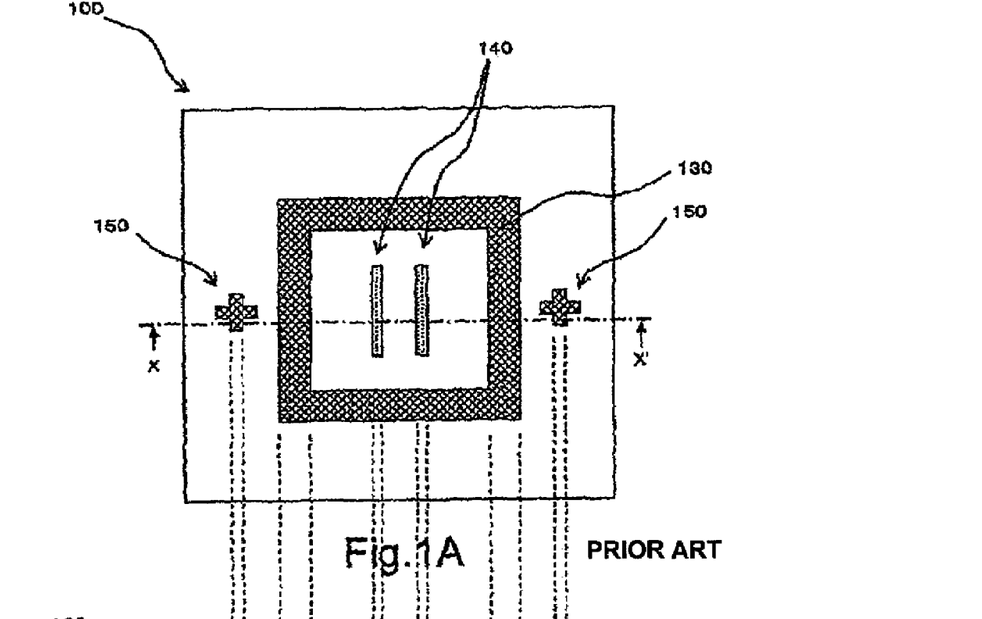
FIG. 1A is a plan view schematically showing an example of a conventional attenuated phase shift mask.

A conventional phase shift mask will be described below with reference to the drawings. FIG. 1A is a plan view schematically showing an example of a typical attenuated phase shift mask, and FIG. 1B is a cross-sectional view taken along the line I-I' of FIG. 1A.

Figure 1B:
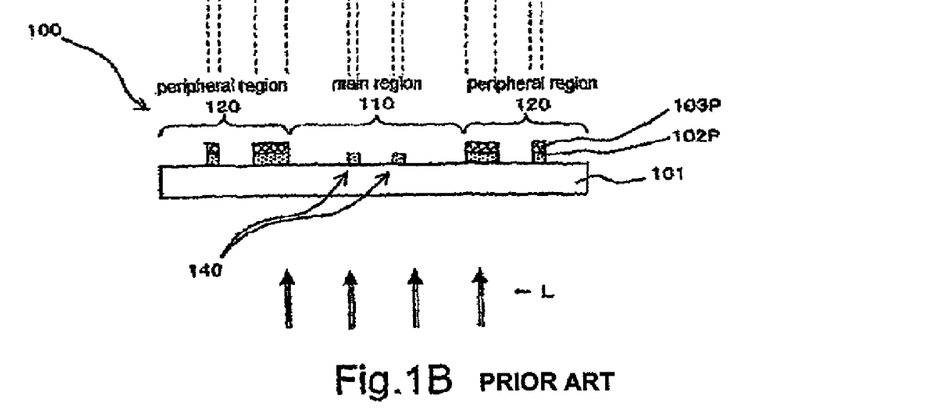
FIG. 1B is a cross-sectional view taken along the line I-I' of FIG. 1A.

In a conventional attenuated phase shift mask 100, as shown in FIG. 1B, a phase shift pattern 102P composed of a translucent attenuated phase shift layer 102 and a light-shielding pattern 103P composed of a light-shielding layer 103 are deposited in that order on a transparent substrate 101.

In a main region 110, a pattern 140 corresponding to a circuit pattern provided on a wafer (hereinafter referred to as a "transfer pattern") is disposed. This transfer pattern 140 is composed of the phase shift layer 102. Utilizing this transfer pattern 140, exposure light is transmitted with the phase of the exposure light being inverted by 180 degrees. Conversely, in the remaining regions of the transparent substrate 101 exposure light is transmitted with out inversion.

Note that projection exposure light is applied to the phase shift mask 100 in a direction indicated by the arrow L in FIG. 1B.

In a peripheral region 120, a light-shielding zone 130 is formed along the border between the main region 110 and the peripheral region 120. This light-shielding zone 130 prevents multiple patterning exposures to the adjacent chips during the transfer of the transfer pattern 140 to the wafer.

In the peripheral region 120, in addition to the light-shielding zone 130, various patterns are formed, such as alignment marks for aligning the aligner and the mask (fiducial patterns) 150. Furthermore, although not shown in the drawing, other patterns maybe formed in the peripheral region 120 as necessary. Such additional patterns may include, for example, a monitor pattern for measuring positional accuracy of the transfer pattern 140, a target pattern for alignment during each overlay-writing process, a pattern for measuring alignment accuracy used during each overlay-writing process, a pattern for alignment used in defect inspection of the transfer pattern 140, a pattern for alignment used during measurement of line width of the transfer pattern 140, a bar code pattern for identifying a mask, and a numbering pattern for identifying a mask.

A method for fabricating a conventional phase shift mask will now be described. FIGS. 2A to 2E and FIGS. 3F to 3I are each a cross-sectional view showing steps in a method for fabricating the conventional phase shift mask.

Figure 2A:
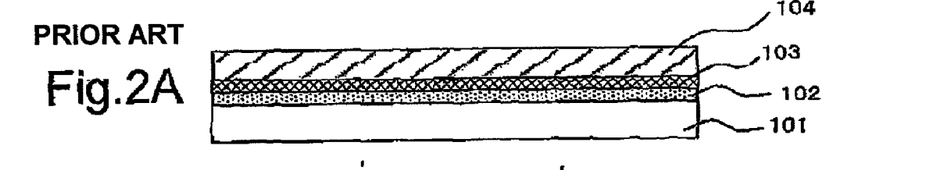
FIGS. 2A to 2E are cross-sectional views showing the steps in a method for fabricating a conventional phase shift mask.

First, a phase shift layer 102 and a light-shielding layer 103 are deposited in that order on a transparent substrate 101, and a first resist layer 104 is then formed thereon (refer to FIG. 2A). As the first resist layer 104, a high-precision negative photoresist is used in order to improve patterning accuracy of a transfer pattern 140.

Figure 2B:
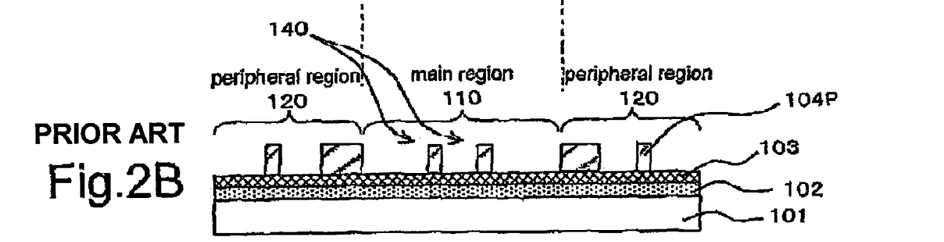
Figure 2C:
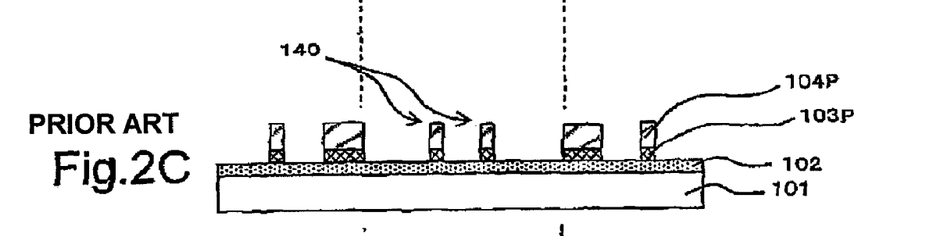
Figure 2D:
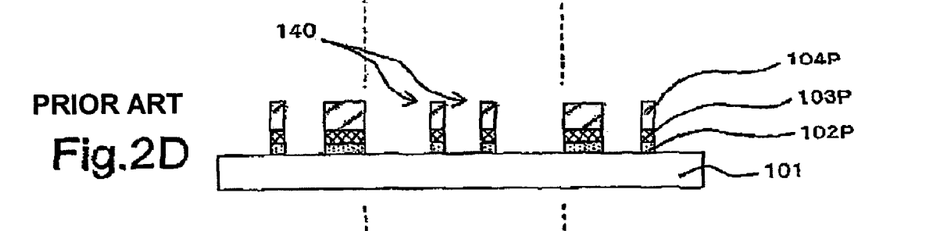

Subsequently, the first resist layer 104 is exposed and developed to form a first resist pattern 104P in the main region 110 and the peripheral region 120 (refer to FIG. 2B).

Using the resist pattern 104P as a mask, the light-shielding layer 103 and the phase shift layer 102 are sequentially etched. Thus, a light-shielding pattern 103P and a phase shift pattern 102P corresponding to the resist pattern 104P are formed (refer to FIGS. 2C and 2D).

Figure 2E:
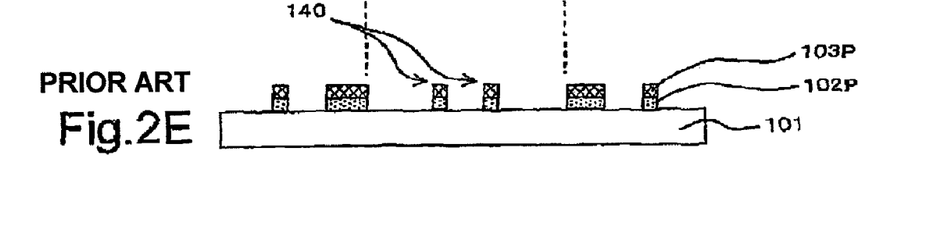

The resist pattern 104P is removed (refer to FIG. 2E). Then, a second resist layer 105 of positive type is formed (refer to FIG. 3F). Exposure and development are then performed on the main region 110 to form a second resist pattern 105 having an opening corresponding only to the main region 110 (refer to FIG. 3G).

Figure 3F:
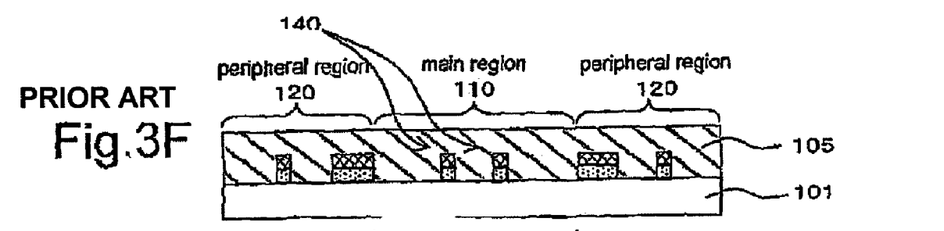
FIGS. 3F to 3I are cross-sectional views showing the steps in the method for fabricating the conventional phase shift mask subsequent to the steps shown in FIGS. 2A to 2E.
Figure 3G:
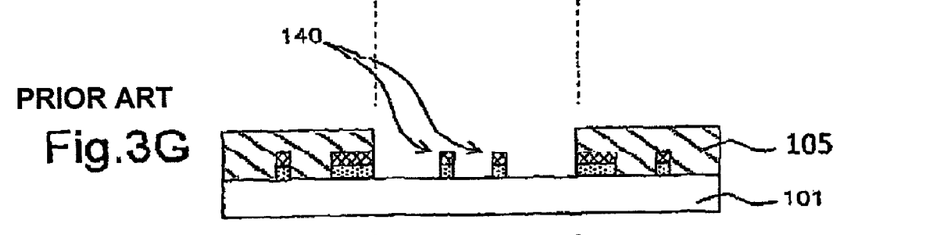
Figure 3H:
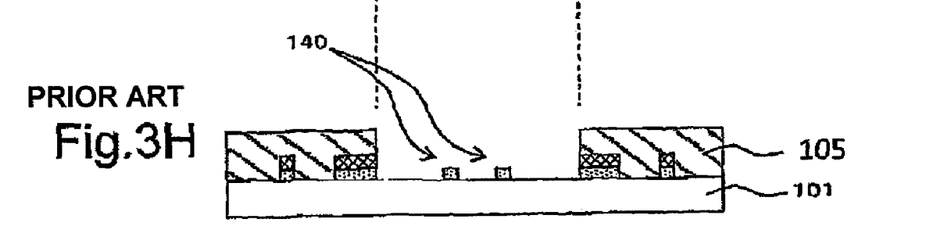
Figure 3I:
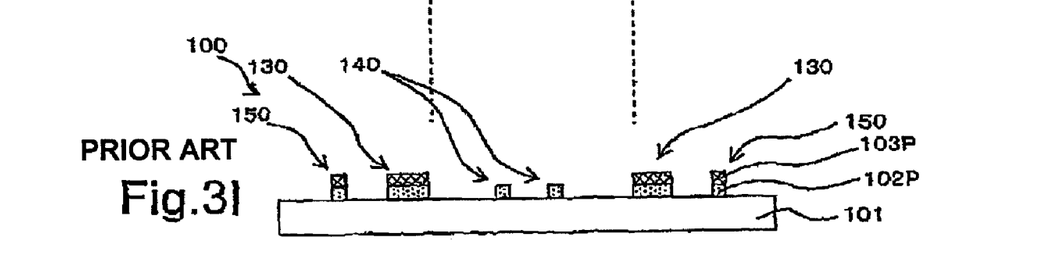

With respect to the pattern 140 exposed in the main region 110, portions composed of the light-shielding layer 103 are selectively etched so that only portions composed of the phase shift layer 102 remain in the main region 110 (refer to FIG. 3H). Finally, the second resist pattern 105 is removed to complete a phase shift mask 100 (refer to FIG. 3I).

As described above, in the conventional phase shift mask, by providing the light-shielding zone 130 in the peripheral region 120, unwanted exposure light does not enter the main region. As a result, adverse affects which maybe caused by the exposure light during the transfer of the circuit pattern to the wafer are prevented.

Furthermore, a blind mechanism (not shown) is provided on the aligner to block unnecessary exposure light. Such unnecessary exposure light is generally referred to as "stray light (flare)".

Even if countermeasures for blocking stray light (flare) are taken as described above, stray light is not completely eliminated. Stray light is caused by reflection of exposure light from an illumination system and lenses of an aligner or a phase shift mask or the like. Hence, stray light still adversely affects the transfer of a circuit pattern to a wafer. As the patterns formed on wafers become finer, the effect of such stray light increases.

In order to overcome the problems associated with stray light, it is conceivable to cover the peripheral region 120 entirely with a light-shielding layer so that light is completely blocked. An example of such a structure is described, for example, in Japanese Unexamined Patent Application Publication No. 8-334885 (paragraphs [0017] and [0018], FIGS. 1 and 2.)

As the pattern formed on a semiconductor chip becomes finer, manufacturing cost of the photomask for forming the pattern increases. It is important to reduce manufacturing cost by decreasing exposure time when a pattern is formed in the photomask. Thus, it is necessary to decrease the area to be exposed by photolithography during the formation of the pattern.

From the standpoint of reduction in manufacturing cost, when the area remaining as a pattern by photolithography is small relative to the whole area (the whole area required for pattern formation on a surface of the photomask), a negative photoresist is used. This is because the negative photoresist allows only the portion exposed to remain (type (A)). In contrast, when the area remaining as a pattern is large relative to the whole area, a positive photoresist is used, because the positive photoresist allows only the portion exposed to be removed (type (B)).

In the above disclosed related art, since the phase shift mask disclosed in JP Pat. App. No. 8-334885 corresponds to type (B), a positive photoresist is assumed to be used (as the first resist layer 14 described in FIG. 3 of JP Pat. App. No. 8-334885).

On the other hand, the present inventor has observed that in view of patterning accuracy, the negative photoresist generally enables higher-precision patterning compared with the positive photoresist. Therefore, in the phase shift mask described in JP Pat. App. No. 8-334885, with respect to the formation of a transfer pattern, high patterning accuracy cannot be expected.

The inventor has observed that when a transfer pattern composed of a phase shift layer, such as a photomask for forming a gate, is formed by electron beam irradiation and a negative photomask is used, a portion irradiated with the electron beam becomes the transfer pattern after etching. Consequently, the accuracy of line width in the transfer pattern depends only on the energy profile of the electron beam applied.

The inventor has further observed that when a positive photomask is used, a portion irradiated with the electron beam corresponds to a pattern in which a transparent substrate is exposed (without formation of a phase shift layer). That is, the transfer pattern is formed by irradiating both sides of the transfer pattern with an electron beam. Consequently, the accuracy of line width in such a transfer pattern is greatly affected by the positional accuracy of irradiation of the electron beam in addition to the energy profile of the electron beam.

In a general photomask, such as a photomask for forming a gate, a negative photomask is more advantageous. On the other hand, in a photomask patterning wherein the exposed transparent substrate corresponds to a transfer pattern, as in the case for forming a hole layer, a positive photomask is more advantageous.

Additionally, when patterning is performed by type (A) photolithography, described above (i.e. if a negative photoresist with high patterning accuracy is used), a long period of time is required for exposure. This extended time results in an increase in manufacturing cost. Also, strain tends to occur in the photomask due to prolonged heat exposure.

As described above in the related art, in the phase shift mask disclosed in JP Pat. App. No. 8-334885, the light-shielding layer remains in the entire peripheral region. In addition, as discussed above, JP Pat. App. No. 8-334885 is type (B). Therefore, the related art does not achieve both reduction in manufacturing cost and high-precision patterning.

Additionally, the phase shift mask formation process is described in the JP Pat. App. No. 8-334885 disclosed in Patent Document 2 ((a)~(e) of FIG. 3).

SUMMARY OF THE INVENTION

Therefore, one possible object is to provide a novel and useful photomask and a method of manufacturing the photomask and a method of manufacturing a semiconductor device.

The inventor proposes a photomask which can achieve high patterning accuracy of a circuit pattern transferred to a wafer and can suppress the effect of stray light without drastically increasing cost.

In order to overcome the problems described above, the inventor has found that a phase shift layer, which is used for enhancing contrast of a circuit pattern, can be used for absorbing stray light. In such a case, by devising a method for fabrication as described below, it is possible to fabricate a high-accuracy photomask while suppressing an increase in cost. Thus, the present invention has been achieved.

One aspect of the present invention is a method for fabricating a photomask. The photomask includes a transfer pattern composed of a phase shift layer for shifting a phase of exposure light, the transfer pattern being disposed in a main region for transferring a circuit pattern onto a wafer, a light-shielding zone for blocking the exposure light, and a light-absorbing pattern composed of the phase shift layer only, the light-shielding zone and the light-absorbing pattern being disposed in a peripheral region other than the main region.

The method for forming the photomask includes the steps of forming the phase shift layer, the light-shielding layer, and a negative resist layer in that order on a transparent substrate, forming a first resist pattern, including a pattern corresponding to the transfer pattern, by performing first exposure and development on the negative resist layer, forming a light-shielding pattern by etching the light-shielding layer using the first resist pattern as a mask, removing the first resist pattern, and then forming a positive resist layer thereon, forming a second resist pattern including a pattern corresponding to the light-absorbing pattern by performing second exposure and development on the positive resist layer, and forming a phase shift pattern by etching the phase shift layer using the second resist pattern as a mask.

In the construction described above, with respect to the photomask of the present invention, a negative photoresist is used for patterning of the transfer pattern so that high patterning accuracy is achieved on a wafer. Also, since the phase shift layer is composed of the negative photoresist and does not require removal by patterning in the peripheral region, problems, such as an increase in cost, do not occur.

Furthermore, because of the light absorbing effect of the phase shift layer (light-absorbing pattern) remaining in the peripheral region, the phase shift layer absorbs stray light, and the amount of stray light is greatly decreased. As a result, when a circuit pattern is formed by patterning on the wafer, the influence of stray light is suppressed.

According to another aspect of the present invention, a photomask for transferring a circuit pattern onto a wafer includes a phase shift layer which shifts a phase of light and a light-shielding layer which blocks light disposed in that order on a transparent substrate, a desired pattern being formed on the photomask, wherein the photomask includes a main region for transferring the circuit pattern and a peripheral region other than the main region, the main region includes a transfer pattern composed of the phase shift layer and corresponds to the circuit pattern, and the peripheral region includes a light-shielding zone composed of the phase shift layer and the light-shielding layer disposed along the border between the main region and the peripheral region, a light-absorbing pattern composed of the phase shift layer only outside the light-shielding zone, and an alignment mark which is formed together with the transfer pattern and which adjusts the transfer position of the transfer pattern.

In another aspect of the present invention, a method for fabricating a semiconductor device includes a step of performing exposure using a photomask for transferring a circuit pattern onto a wafer, the photomask including a phase shift layer which shifts a phase of light and a light-shielding layer which blocks light, the phase shift layer and the light-shielding layer being disposed in that order on a transparent substrate, a desired pattern being formed on the photomask, wherein the photomask includes a main region for transferring the circuit pattern and a peripheral region other than the main region, the main region includes a transfer pattern composed of the phase shift layer and corresponds to the circuit pattern, and the peripheral region includes a light-shielding zone composed of the phase shift layer and the light-shielding layer disposed along the border between the main region and the peripheral region, a light-absorbing pattern composed of the phase shift layer only outside the light-shielding zone, and an alignment mark which is formed together with the transfer pattern and which adjusts the transfer position of the transfer pattern.

In the constructions described above, since the "alignment mark" in the peripheral region and the "transfer pattern", which requires high positional accuracy with respect to the alignment mark, in the main region are formed by patterning in the same step, it is possible to achieve high-accuracy patterning on the wafer.

In accordance with the present invention, with respect to a photomask used for projection exposure, it is possible to suppress the effect of stray light without drastically increasing cost while achieving high patterning accuracy of a circuit pattern transferred to a wafer.

DETAILED DESCRIPTION OF THE INVENTION

The present invention will be described in more detail below with reference to the drawings. Specifically, a photomask and a method for fabricating the photomask according to the present invention will be described with reference to FIGS. 4A and 4B, 5A to 5E, and 6F to 6I.

Figure 4A:
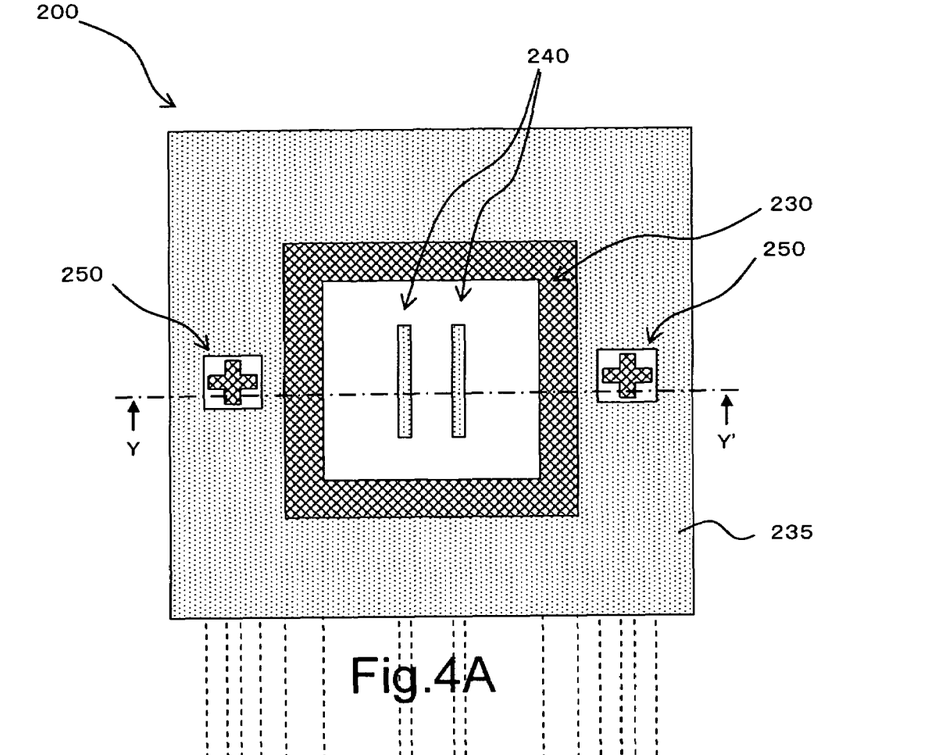
FIG. 4A is a plan view schematically showing an example of a photomask according to an embodiment of the present invention.

First, a structure of a phase shift mask (photomask) according to an embodiment of the present invention will be described with reference to FIGS. 4A and 4B. FIG. 4A is a plan view and FIG. 4B is a cross-sectional view taken along the line II-II' of FIG. 4A.

Figure 4B:
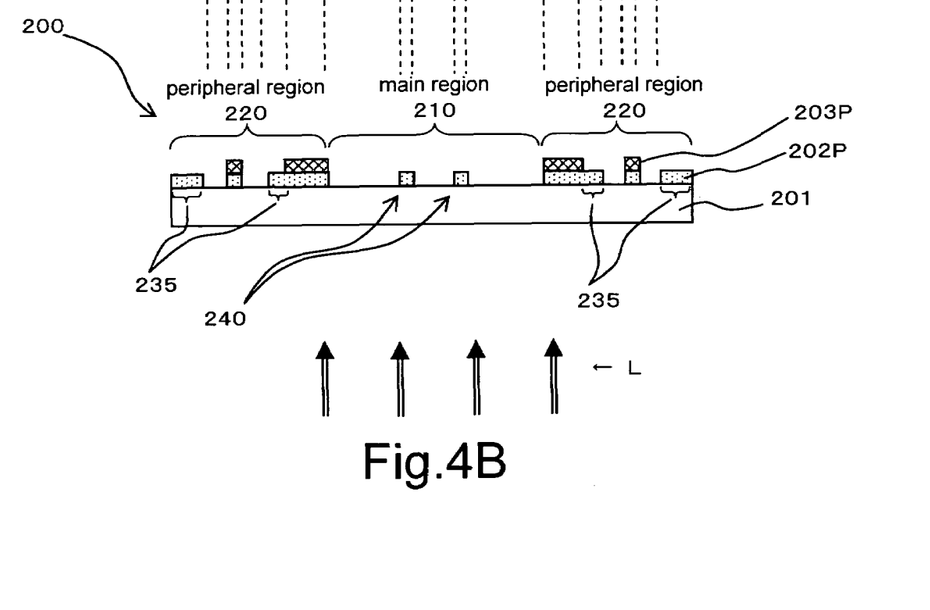
FIG. 4B is a cross-sectional view taken along the line II-II' of FIG. 4A.

As shown in FIG. 4B, in a phase shift mask 200, a phase shift pattern 202P composed of a phase shift layer 202 and a light-shielding pattern 203P composed of a light-shielding layer 203 are deposited in that order on a transparent substrate 201. The transparent substrate 201 is, for example, a synthetic quartz substrate.

The phase shift layer 202 and the light-shielding layer 203 are each composed of a material which can be selectively etched. For example, the phase shift layer 202 is composed of an oxynitride of molybdenum silicide (MoSiON), and the light-shielding layer 203 is composed of a laminate of chromium (Cr) and chromium oxide ($Cr_xO_y$).

The transmittance of the phase shift layer 202 is generally about 6% relative to the transmittance of the transparent substrate 201 being set at 100%.

In a main first region 210, a pattern corresponding to a circuit pattern provided on a wafer (hereinafter referred to as a "transfer pattern 240") is composed of the phase shift layer 202. In the transfer pattern 240, exposure light is transmitted with the phase of the exposure light being inverted by 180 degrees. On the other hand, in the other region in which the transparent substrate 201 is exposed, exposure light is transmitted without inversion.

Note that projection exposure light is applied to the phase shift mask 200 in a direction indicated by the arrow L in FIG. 4B.

In a peripheral second region 220, a light-shielding zone 230 is disposed along the border between the main region 210 and the peripheral region 220 in order to prevent multiple exposure to the adjacent chips during the transfer of the transfer pattern to the wafer. Furthermore, a light-absorbing pattern 235 which is composed of the phase shift layer 202 only and which absorbs stray light is disposed outside the light-shielding zone 230.

In the peripheral region, in addition to the light-shielding zone 230, various patterns are formed, such as alignment marks for aligning the aligner and the mask (fiducial patterns) 250. Furthermore, although not shown in the drawing, other patterns maybe formed as required in the peripheral region. Examples of such patterns include: a monitor pattern for measuring positional accuracy of the transfer pattern 240, a target pattern for alignment during each overlay-writing process, a pattern for measuring alignment accuracy used during each overlay-writing process, a pattern for alignment used in defect inspection of the transfer pattern 240, a pattern for alignment used during measurement of line width of the transfer pattern 240, a bar code pattern for identifying a mask, and a numbering pattern for identifying a mask.

FIGS. 5A to 5E and 6F to 6I are each a cross-sectional view showing a step in the method for fabricating the phase shift mask of the present invention.

Figure 5A:
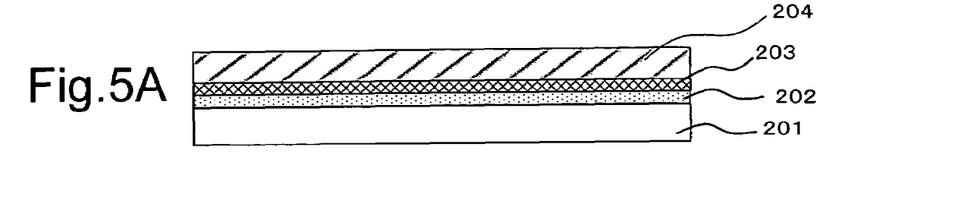
FIGS. 5A to 5E are cross-sectional views showing the steps in a method for fabricating a photomask according to an embodiment of the present invention.

First, a phase shift layer 202 and a light-shielding layer 203 are deposited in that order on a transparent substrate 201, and a first resist layer 204 is formed thereon by spin-coating (refer to FIG. 5A). As the first resist layer 204, a high-precision negative photoresist is used in order to improve patterning accuracy of a transfer pattern 240.

Figure 5B:
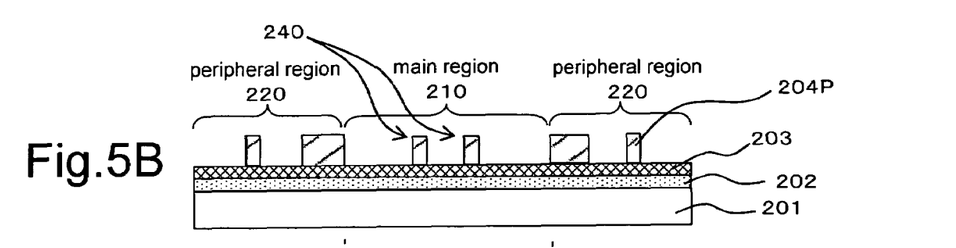
Figure 5C:
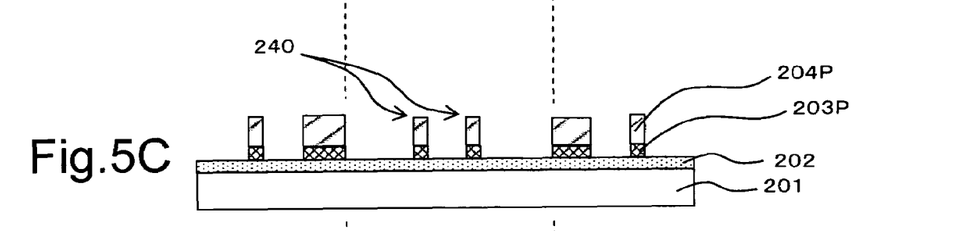

Subsequently, the first resist layer 204 is exposed and developed to form a first resist pattern 204P in a main region 210 and a peripheral region 220 (refer to FIG. 5B). Herein, with respect to the exposure on the first resist layer 204, electron-beam exposure is performed giving priority to ensuring patterning accuracy.

Using the first resist pattern 204P as a mask, the light-shielding layer 203 only is selectively etched. Thus, a light-shielding pattern 203P corresponding to the first resist pattern 204P is formed (refer to FIG. 5C).

Figure 5D:
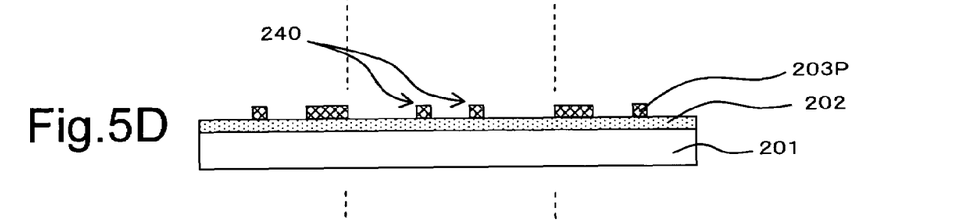

The first resist pattern 204P is removed (refer to FIG. 5D). Then, a second resist layer 205 of positive type is formed by spin-coating (refer to FIG. 5E). Subsequently, exposure and development are performed on the main region 210 and alignment marks 250 to form a second resist pattern 205P having openings corresponding to the main region 210 and the predetermined regions for the alignment marks 250 (openings 251 in FIG. 6F). With respect to the exposure on the second resist layer 204, laser-beam exposure is performed giving priority to ensuring the processing rate of patterning.

Subsequently, using the second resist pattern 205P as a mask, the phase shift layer 202 is etched. Thus, a light-shielding pattern 203P corresponding to the second resist pattern 204P is formed (refer to FIG. 6F).

Figure 6F:
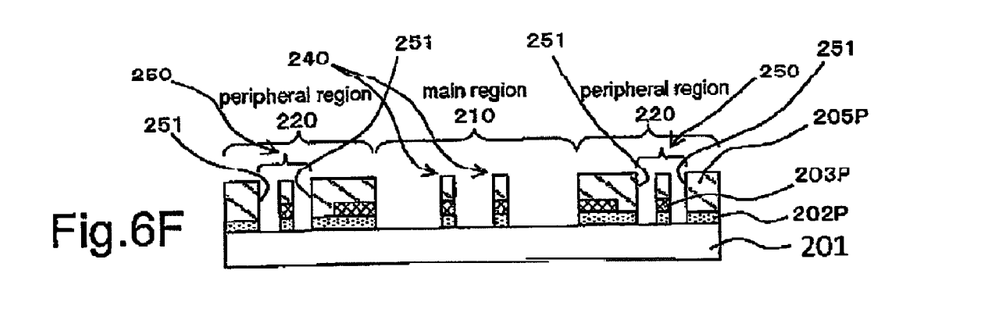
FIGS. 6F to 6I are cross-sectional views showing the steps in the method for fabricating the photomask according to the embodiment of the present invention subsequent to the steps shown in FIGS. 5A to 5E.

In this embodiment, the second resist pattern 205P is also used as an etching mask for the light-shielding layer 203. At this stage, damage to the light-shielding film (composed of the light-shielding layer 203) for the alignment mark 250 must be minimized as much as possible. Therefore, alignment of the second resist pattern 205P to the underlayer must be performed strictly to ensure accuracy.

Figure 6G:
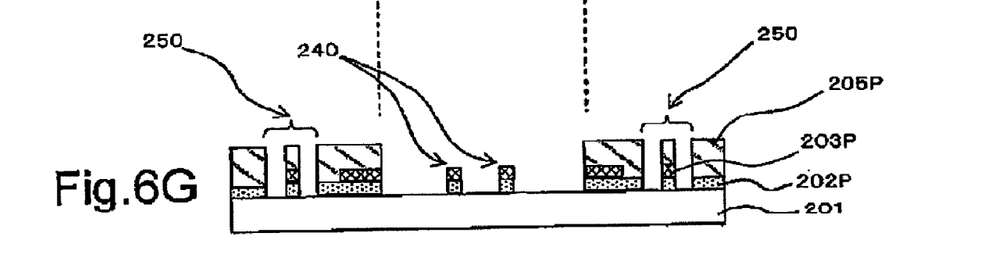

With respect to the transfer pattern 240 exposed in the main region 210, the second resist pattern 205P is removed (refer to FIG. 6G). Subsequently, with respect to the transfer pattern 240 exposed in the main region 210, surface portions composed of the light-shielding layer 203 are selectively etched so that portions composed of the phase shift layer 202 remain (refer to FIG. 6H).

Figure 6H:
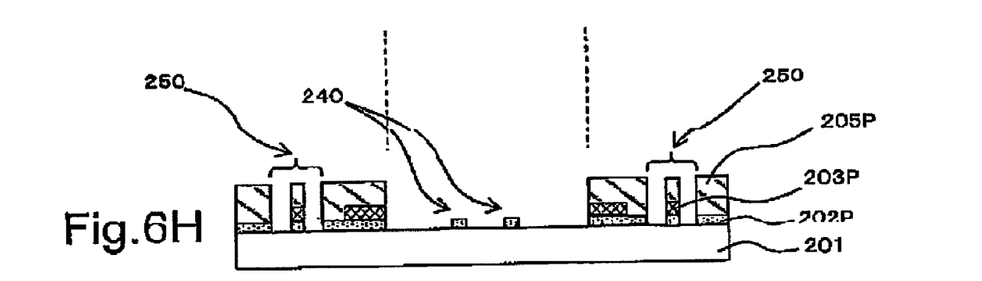

With respect to the selective etching of the surface portions composed of the light-shielding layer 203, wet etching is preferably used. The reason for this is that when the phase shift layer 202 is etched using the second resist pattern 205P as a mask, the thickness of the second resist pattern 205P is decreased. If dry etching is performed, there is a possibility that the second resist pattern 205P may disappear before the surface portions composed of the light-shielding layer 203 are removed. In such a case, with respect to the transfer pattern 240, there is a risk that portions composed of the light-shielding layer 203 may be affected.

Figure 6I:
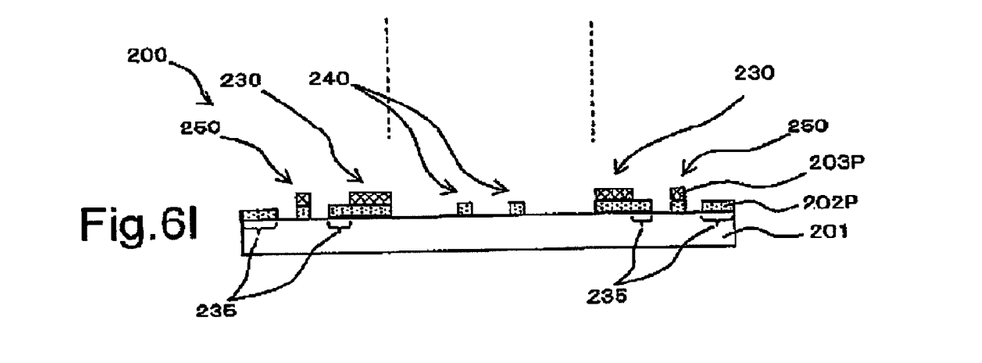

Finally, the second resist pattern 205P is removed to complete a phase shift mask 200 including a light-absorbing pattern 235 which absorbs stray light (refer to FIG. 6I).

As described above, according to this embodiment of the present invention, in the phase shift mask 200 a pattern composed of the phase shift layer 202 is allowed to remain in substantially the entire peripheral region 220. As a result, a substantial increase in cost, which may result from the case in which the light-shielding layer 203 is allowed to remain, is avoided. Thus the manufacturing cost of the phase shift mask 200 is reduced.

Figure 5E:
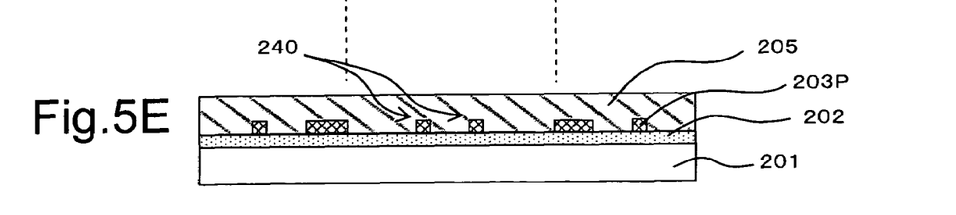

The reason for the reduction in the manufacturing cost is that, as shown in FIG. 5E and FIG. 6F, patterning of the phase shift layer 202 does not include patterning of the transfer pattern 240. The transfer pattern 240 requires high-precision patterning. Instead, the present invention uses a positive resist pattern as the second resist pattern 205.

Moreover, in the phase shift mask 200, an adverse effect due to stray light is eliminated when a circuit pattern is transferred to a wafer. The reason for the elimination of the adverse effect due to stray light is that during the transfer of a circuit pattern onto a wafer, when exposure light projected to the peripheral region 220 passes through the transparent substrate 201 and reaches the phase shift pattern 202P, the phase shift pattern 202P absorbs the exposure light. This absorption considerably attenuates light that is reflected from the surface of the transparent substrate 201. If such attenuation does not occur, light reflected from the surface of the transparent substrate 201 is reflected repeatedly in the aligner and returns to the area of the illumination system as stray light, and affects exposure light in the main region 210.

EXAMPLE

An example of a method for fabricating a device using a photomask according to the present invention will be described below with reference to FIGS. 7A, 7B, 8C, 8D, 9E, 9F, 10G, and 10H.

Figure 7A:
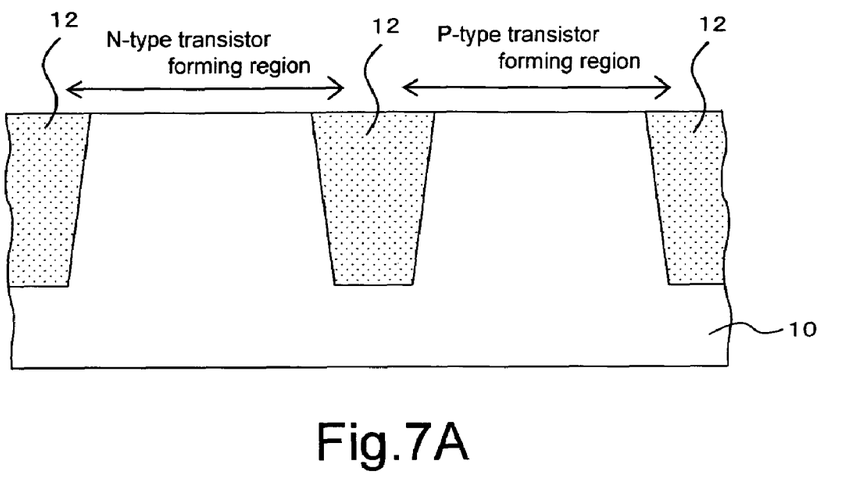
FIGS. 7A and 7B are cross-sectional views showing the steps in a method for fabricating a semiconductor device according to an embodiment of the present invention.

First, in a silicon substrate (wafer) 10, element isolation films 12 embedded in trenches having a depth of, for example, 300 nm are formed, for example, by a shallow trench isolation (STI) process (refer to FIG. 7A). In the drawing, a left-side element region corresponds to an N-type transistor forming region, and a right-side element region corresponds to a P-type transistor forming region.

Figure 7B:
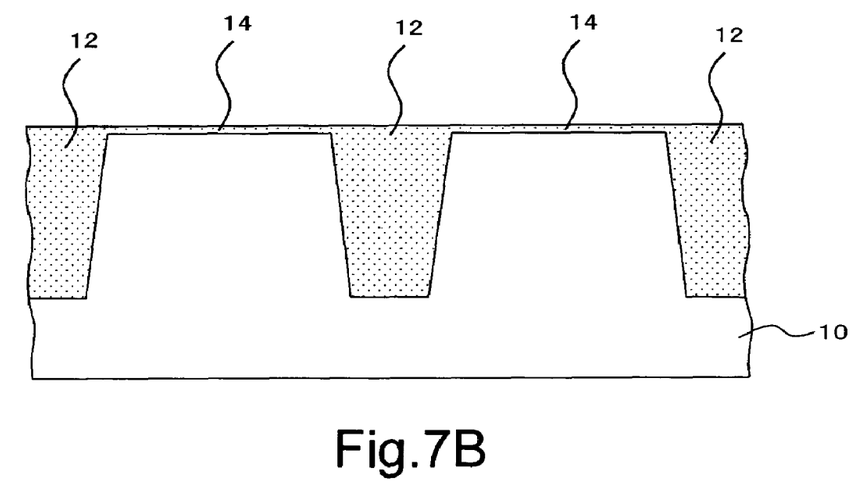

Subsequently, for example, using a thermal oxidation method, a sacrificial oxide film 14 is formed over the element regions delimited by the element isolation films 12 (refer to FIG. 7B).

Figure 8C:
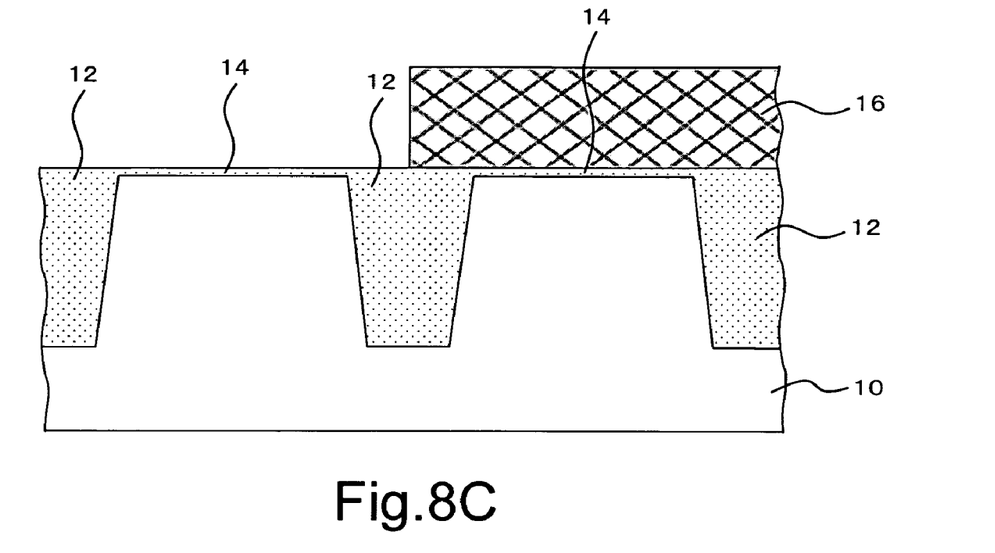
FIGS. 8C and 8D are cross-sectional views showing the steps in the method for fabricating the semiconductor device according to the embodiment of the present invention subsequent to the steps shown in FIGS. 7A and 7B.

Then, a first photoresist film 16 is formed by photolithography so as to expose the N-type transistor forming region and cover the P-type transistor forming region (refer to FIG. 8C).

Figure 8D:
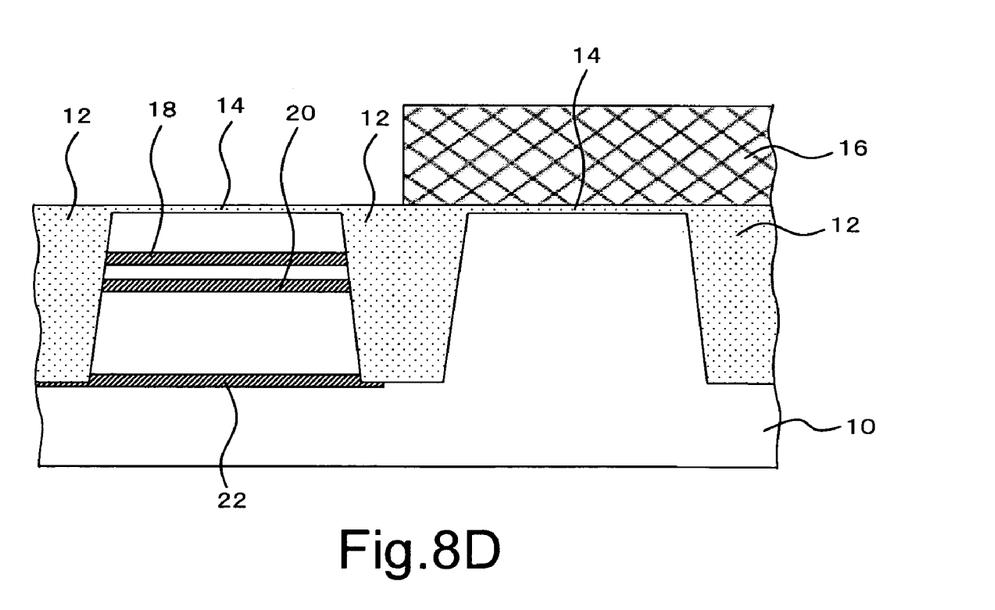

Using the first photoresist film 16 as a mask, ion implantation is performed to form P-type impurity diffusion regions 18, 20, and 22 in the silicon substrate 10 in the N-type transistor forming region (refer to FIG. 8D). The P-type impurity diffusion region 18 is formed, for example, by implantation of indium ions (In$^+$) with an accelerating energy of 60 keV and a dose of $1 \times 10^{13}$ cm$^{-2}$. The P-type impurity diffusion region 20 is formed, for example, by implantation of indium ions with an accelerating energy of 180 keV and a dose of $3 \times 10^{13}$ cm$^{-2}$. The P-type impurity diffusion region 22 is formed, for example, by implantation of boron ions (B$^+$) with an accelerating energy of 150 keV and a dose of $3 \times 10^{13}$ cm$^{-2}$.

Figure 9E:
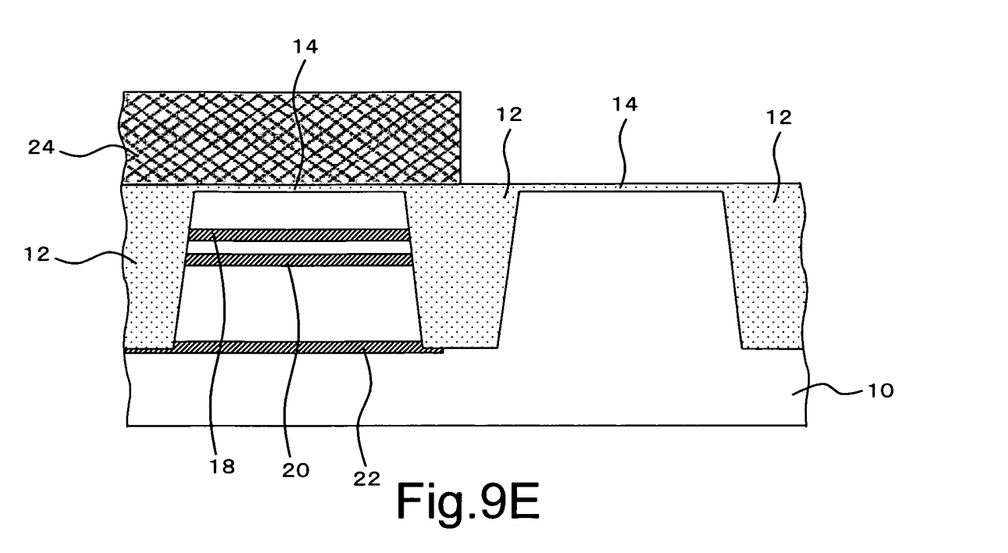
FIGS. 9E and 9F are cross-sectional views showing the steps in the method for fabricating the semiconductor device according to the embodiment of the present invention subsequent to the steps shown in FIGS. 8C and 8D.

Subsequently, the first photoresist film 16 is removed, and then a second photoresist film 24 is formed by photolithography so as to expose the P-type transistor forming region and cover the N-type transistor forming region (refer to FIG. 9E).

Figure 9F:
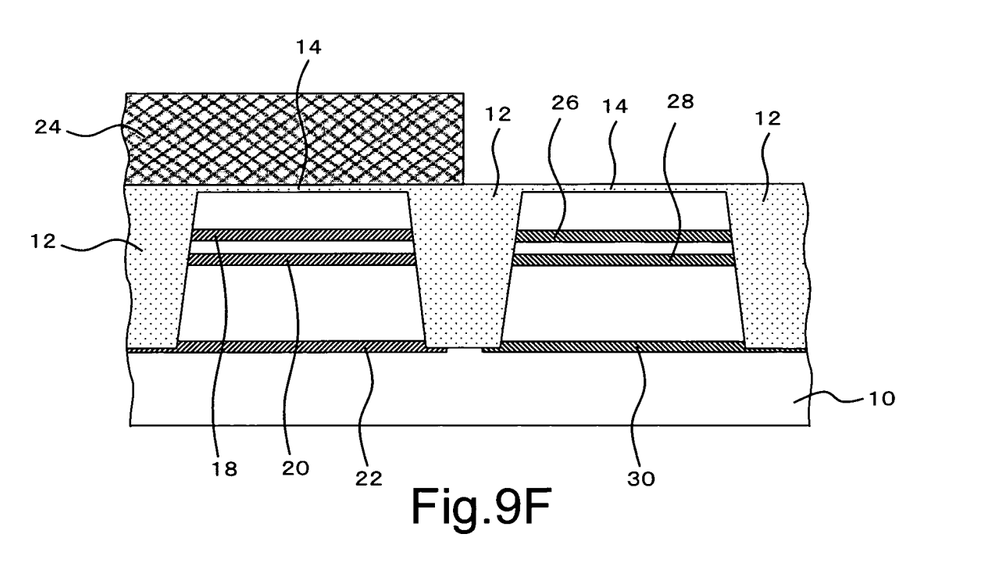

Using the second photoresist film 24 as a mask, ion implantation is performed to form N-type impurity diffusion regions 26, 28, and 30 in the silicon substrate 10 in the P-type transistor forming region (refer to FIG. 9F). The N-type impurity diffusion region 26 is formed, for example, by implantation of arsenic ions (As$^+$) with an accelerating energy of 100 keV and a dose of $5 \times 10^{12}$ cm$^{-2}$. The N-type impurity diffusion region 28 is formed, for example, by implantation of arsenic ions with an accelerating energy of 150 keV and a dose of $3 \times 10^{13}$ cm$^{-2}$. The N-type impurity diffusion region 30 is formed, for example, by implantation of phosphorus ions (P$^+$) with an accelerating energy of 300 keV and a dose of $3 \times 10^{13}$ cm$^{-2}$.

Subsequently, the second photoresist film 24 is removed, and then the sacrificial oxide film 14 is removed, for example, by wet etching using a hydrofluoric acid-based solution.

Subsequently, a silicon oxide film, for example, with a thickness of 11 nm is allowed to grow over the element forming regions exposed by the removal of the sacrificial oxide film 14. The silicon oxide film may be formed, for example, using a thermal oxidation method. Thus forming a gate insulating film 32 composed of the silicon oxide film.

A polysilicon film (not shown), for example, with a thickness of 100 nm, is deposited on the gate insulating film 32. The polysilicon film may be formed, for example, by chemical vapor deposition (CVD).

Subsequently, an organic antireflection film (not shown) with a thickness of about 80 nm is applied onto the polysilicon film. An argon-fluorine (ArF) positive resist (not shown) which is a photosensitive material is further applied thereon at a thickness of about 250 nm to 300 nm.

A pattern of a photomask fabricated according to the embodiment of the present invention is exposed onto the wafer substrate in the state described above by a reduction projection aligner using an ArF excimer laser as a light source. The exposure conditions include a numerical aperture (NA) of 0.7, ½ annular illumination (σ value: 0.425/0.85), and an exposure of 210 J/cm$^2$.

Subsequently, a post exposure bake (PEB) and development are performed to form a resist pattern 38 composed of the positive resist. Using the resist pattern 38 as a mask, the antireflection film and the polysilicon film are etched to form an antireflection film pattern 36 and gate electrodes 40N and 40P (refer to FIG. 10G).

Figure 10G:
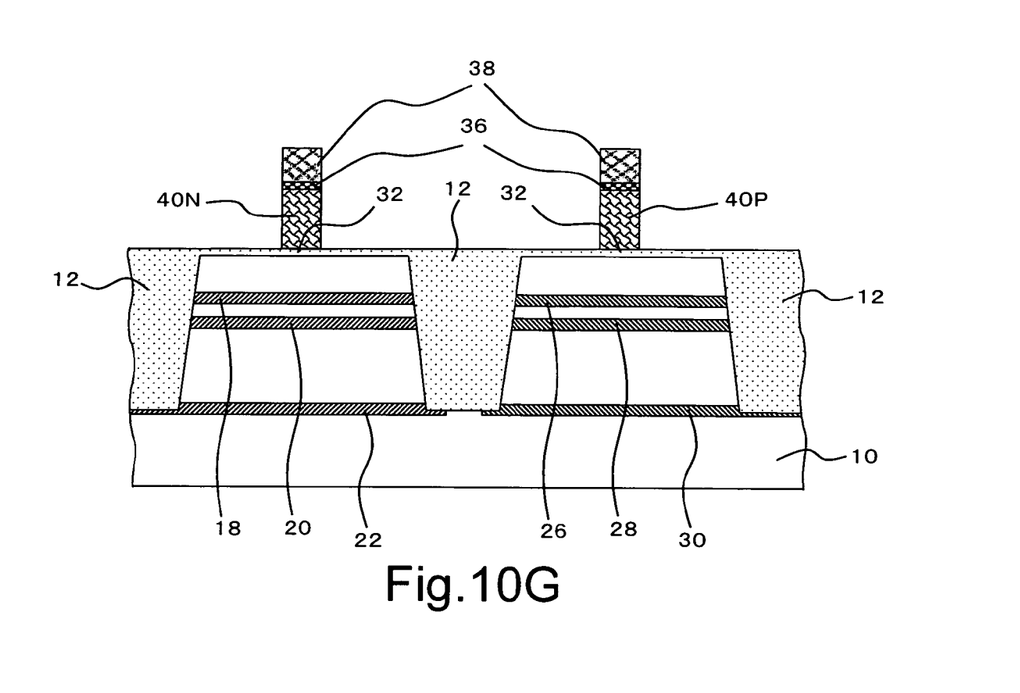
FIGS. 10G and 10H are cross-sectional views showing the steps in the method for fabricating the semiconductor device according to the embodiment of the present invention subsequent to the steps shown in FIGS. 9E and 9F.
Figure 10H:
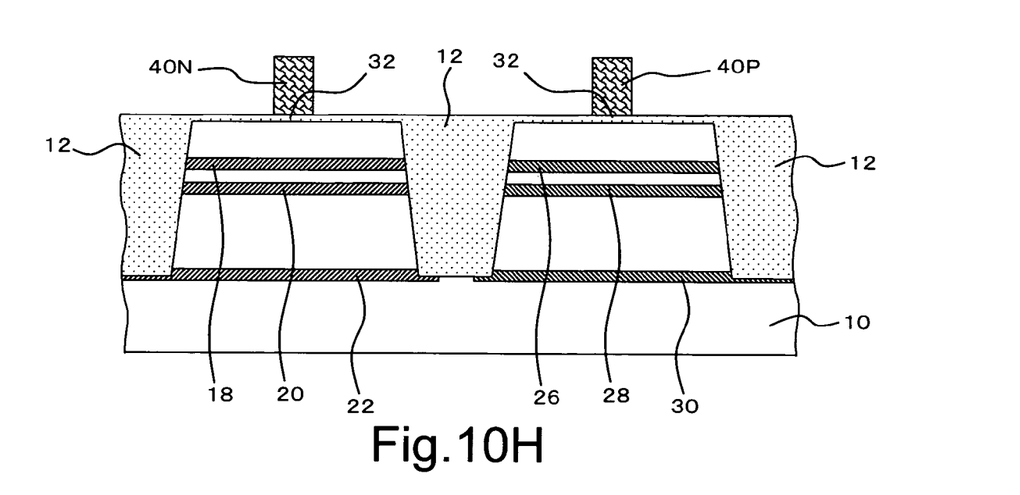

The resist pattern 38 and the antireflection film pattern 36 are removed by ashing to complete the gate electrodes 40N and 40P (refer to FIG. 10H).

Herein, the gate electrode 40N is a gate electrode of the N-type transistor, and the gate electrode 40P is a gate electrode of the P-type transistor.

With respect to the gate electrode pattern formed on the wafer by the fabrication method described above, pattern size uniformity was compared between the case in which a photomask of the present invention was used and a case in which a conventional photomask was used. The pattern size was measured using a scanning electron microscope (SEM).

In the gate electrode pattern formed on the wafer using the photomask of the present invention, the "pattern size uniformity" was 3 nm (3 σ) in a shot. In contrast, in the gate formed on the wafer using the conventional photomask, the "pattern size uniformity" was 6 nm (3 σ). Thus, an improvement by about 3 nm was achieved.

As described above, in the photomask fabricated according to the present invention, accuracy of the circuit pattern formed on the wafer (patterning accuracy) can be greatly improved.

The invention as described above is specifically directed to the noted embodiments. However, the present invention is not restricted to the embodiments. One of skill in the art may modify the described embodiments and still practice the invention as claimed below.

What is claimed is:

1. A method for fabricating an attenuated phase shift photomask including a transfer pattern composed of a phase shift layer for shifting a phase of exposure light, the transfer pattern being disposed in a first region, a light-shielding zone for blocking the exposure light, and a light-absorbing pattern composed of the phase shift layer, the light-shielding zone and the light-absorbing pattern being disposed in a second region separate from the first region, the method comprising:

forming over a transparent substrate in the following order: the phase shift layer, a light-shielding layer, and a negative resist layer;

forming a first resist pattern by performing first exposure and development on the negative resist layer;

forming a light-shielding pattern by etching the light-shielding layer using the first resist pattern as a first etching mask;

removing the first resist pattern, and then forming a positive resist layer;

forming a second resist pattern including a pattern corresponding to the light-absorbing pattern by performing second exposure and development on the positive resist layer;

forming a phase shift pattern by etching the phase shift layer using the second resist pattern as a second etching mask;

after the step of forming the phase shift pattern, selectively removing only portions composed of the second resist pattern located on the first region;

after selectively removing only portions composed of the second resist pattern located on the first region, removing the light-shielding layer on the first region; and after removing the light-shielding layer on the first region, removing the second resist pattern.

2. The method for fabricating the attenuated phase shift photomask according to claim 1, wherein the light-absorbing pattern composed of the phase shift layer only is formed in the second region.

3. The method for fabricating the attenuated phase shift photomask according to claim 1, wherein the first exposure is electron-beam exposure, and the second exposure is laser-beam exposure.

4. The method for fabricating the attenuated phase shift photomask according to claim 1, wherein an alignment mark for adjusting a transfer position of the transfer pattern is disposed in the second region, and in the step of forming the first resist pattern, the first resist pattern includes a pattern corresponding to the alignment mark and a circuit pattern.

5. The method for fabricating the attenuated phase shift photomask according to claim 1, wherein the light-shielding layer is composed of a material having a disproportionate etching rate as compared to that of the phase shift layer.

6. The method for fabricating the attenuated phase shift photomask according to claim 5, wherein the phase shift layer is composed of an oxynitride of molybdenum silicide (MoSiON), and the light-shielding layer is composed of a laminated chromium (Cr) and chromium oxide.

7. The method for fabricating the attenuated phase shift photomask according to claim 1, wherein the etching of the light-shielding layer after the formation of the first resist pattern is wet etching.

8. The method for fabricating the attenuated phase shift photomask according to claim 1, wherein writing data for forming the second resist pattern include first pattern data for forming an opening in a predetermined area in the first region and second pattern data for forming at least a portion of an alignment pattern.

9. A method for fabricating an attenuated phase shift photomask including a transfer pattern composed of a phase shift layer for shifting a phase of exposure light, the transfer pattern being disposed in a first region, a light-shielding zone for blocking the exposure light, and a light-absorbing pattern composed of the phase shift layer, the light-shielding zone and the light-absorbing pattern being disposed in a second region separate from the first region, the method comprising:

forming over a transparent substrate in the following order: the phase shift layer, the light-shielding layer, and a negative resist layer;

forming a first resist pattern by performing first exposure and development on the negative resist layer;

forming a light-shielding pattern by etching the light-shielding layer using the first resist pattern as a first etching mask;

removing the first resist pattern, and then forming a positive resist layer;

forming a second resist pattern including a pattern corresponding to the light-absorbing pattern by performing second exposure and development on the positive resist layer; and forming a phase shift pattern by etching the phase shift layer using the second resist pattern as a first etching mask, wherein an alignment mark for adjusting a transfer position of the transfer pattern is disposed in the second region, and in the step of forming the first resist pattern, the first resist pattern includes a pattern corresponding to the alignment mark and a circuit pattern.

10. The method for fabricating the attenuated phase shift photomask according to claim 9, wherein the light-absorbing pattern composed of the phase shift layer only is formed in the second region.

11. The method for fabricating the attenuated phase shift photomask according to claim 9, wherein the first exposure is electron-beam exposure, and the second exposure is laser-beam exposure.

12. The method for fabricating the attenuated phase shift photomask according to claim 9, wherein the light-shielding layer is composed of a material having a disproportionate etching rate as compared to that of the phase shift layer.

13. The method for fabricating the attenuated phase shift photomask according to claim 12, wherein the phase shift layer is composed of an oxynitride of molybdenum silicide (MoSiON), and the light-shielding layer is composed of a laminated chromium (Cr) and chromium oxide.

14. The method for fabricating the attenuated phase shift photomask according to claim 9, wherein the etching of the light-shielding layer after the formation of the first resist pattern is wet etching.

15. The method for fabricating the attenuated phase shift photomask according to claim 9, wherein writing data for forming the second resist pattern include first pattern data for forming an opening in a predetermined area in the first region and second pattern data for forming at least a portion of an alignment pattern

* * * * *